United States Patent [19]
Meissner

[11] Patent Number: 6,043,982
[45] Date of Patent: Mar. 28, 2000

[54] INTEGRATED CIRCUIT PACKAGE HAVING A THERMOELECTRIC COOLING ELEMENT THEREIN

[75] Inventor: Edward G. Meissner, Dallas, Tex.

[73] Assignee: Raytheon Company, Lexington, Mass.

[21] Appl. No.: 09/053,573

[22] Filed: Apr. 1, 1998

[51] Int. Cl.[7] .................................................. H05K 7/20
[52] U.S. Cl. ............................. 361/704; 62/3.2; 257/930
[58] Field of Search .................................. 62/3.2, 3.6, 3.7; 165/80.2, 80.3, 185; 257/706, 712, 713, 749, 930; 136/203–208; 361/704, 705, 713, 714, 717–719, 784, 785

[56] References Cited

U.S. PATENT DOCUMENTS

| | | |
|---|---|---|
| 4,279,292 | 7/1981 | Swiatosz . |
| 5,430,322 | 7/1995 | Koyanagi . |
| 5,515,238 | 5/1996 | Fritz . |
| 5,637,921 | 6/1997 | Borward-Hoy . |
| 5,724,818 | 3/1998 | Iwata . |

FOREIGN PATENT DOCUMENTS

| | | |
|---|---|---|
| 0 447 020 A1 | 9/1991 | European Pat. Off. . |
| 4-246870 | 9/1992 | Japan . |
| 8-139343 | 5/1996 | Japan . |

*Primary Examiner*—Gerald Tolin
*Attorney, Agent, or Firm*—Baker & Botts, L.L.P.

[57] ABSTRACT

A package (10, 60, 80) has a chamber (24) containing an integrated circuit (13) which detects infrared radiation. The package has on one side of the integrated circuit a portion (23) transparent to infrared radiation, and has on the opposite side of the integrated circuit a first part (12) which supports the integrated circuit. A second part (36) of the package is spaced from the first part (12) on the side thereof opposite from the integrated circuit. Thermoelectric cooling elements (51) are provided between and are thermally coupled to the first and second parts. Electrically conductive further elements (44) are also disposed between the first and second parts. A first arrangement (32, 29, 17, 18) electrically couples a terminal on the integrated circuit to a first end of the further element. A second arrangement (41, 38) electrically couples each further element to a respective pad (42) disposed on the side of the second part opposite from the first part. Some of the thermoelectric cooling elements may have one cross-sectional shape, others may have a different cross-sectional shape, and the further elements may have still another cross-sectional shape.

17 Claims, 2 Drawing Sheets

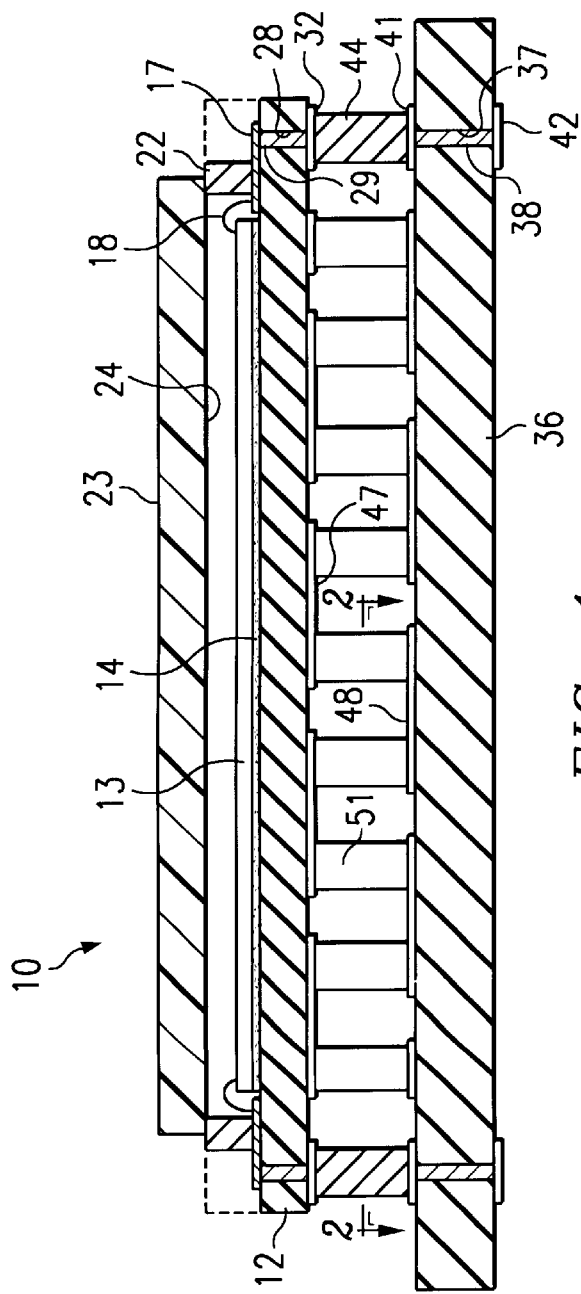
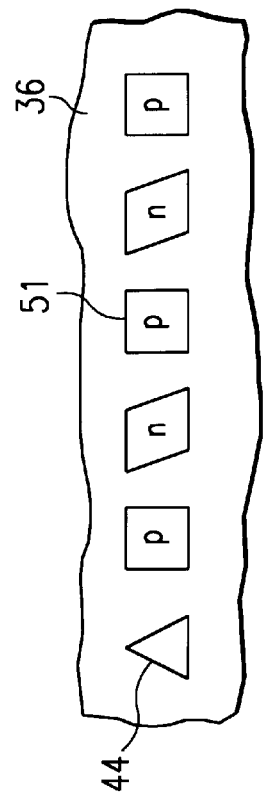
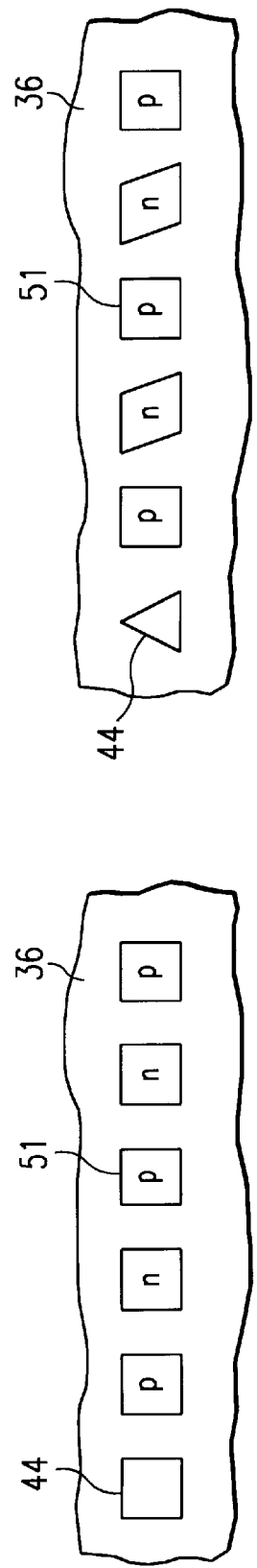

INTEGRATED CIRCUIT PACKAGE HAVING A THERMOELECTRIC COOLING ELEMENT THEREIN

TECHNICAL FIELD OF THE INVENTION

This invention relates in general to an integrated circuit package and, more particularly, to an integrated circuit package which has at least one thermoelectric cooling element therein.

BACKGROUND OF THE INVENTION

There are various types of integrated circuits which require cooling for optimal operation. One such integrated circuit is an infrared radiation detector. An existing technique for cooling such an integrated circuit is to incorporate a number of thermoelectric cooling elements (TECs) into a package for the integrated circuit.

For example, one known package includes first and second parts which are each thermally conductive and electrically insulating, the first part having the integrated circuit supported on a side thereof opposite from the second part. A plurality of thermoelectric cooling elements are provided between the first and second parts, in thermal engagement therewith. A window which is transparent to infrared radiation is provided at a location spaced from the integrated circuit, on a side of the integrated circuit remote from the first part. A frame extends between and is sealingly secured to peripheral edges of the window and the second part, the first part and the integrated circuit being located within the frame.

The region within the frame and between the window and second part serves as a chamber, which is subject to a vacuum. The second part has a plurality of via openings therethrough which are each filled with a conductive material, and has on each side thereof a plurality of pads which are each aligned with and engage the conductive material in a respective one of the via openings. A plurality of relatively long wirebonds each extend from the integrated circuit to a respective one of the pads on the second part. This known integrated circuit package has been generally adequate for its intended purposes. However, it has not been satisfactory in all respects.

More specifically, the known package cannot be manufactured as inexpensively as is desirable. Further, the wirebonds therein are relatively long, which increases manufacturing difficulties. In addition, the mechanical interconnection between the first and second parts is effected only by the thermoelectric cooling elements disposed therebetween, whereas a stronger mechanical coupling would be advantageous. Another consideration is that, because the TEC elements are disposed in the same chamber as the integrated circuit, and since TEC elements have a tendency to outgas when subjected to a vacuum, it can be difficult to obtain a suitable vacuum within the chamber which includes the integrated circuit. Yet another consideration is that it would be desirable to reduce the size of the package, while obtaining less restrictive manufacturing tolerances, and while providing a package which is easier to manufacture.

Also, some of the TEC elements are n-type elements and others are p-type elements. In the known package they all have the same cross-sectional shape. The n-type elements and the p-type elements are thus visually the same, and can be distinguished only by electrical testing. If n-type and p-type elements become mixed up, the cooling efficiency of the package can be degraded. Consequently, in order to ensure proper assembly, extra care must be exercised on the assembly line, which is tedious and increases the cost of the product.

SUMMARY OF THE INVENTION

From the foregoing, it may be appreciated that a need has arisen for an integrated circuit package which has a low cost, which is easy to manufacture, which has liberal manufacturing tolerances, which is relatively small, which avoids the problem of TEC outgassing in the presence of a vacuum, and/or which is mechanically strong. According to the present invention, an apparatus is provided to address this need, and includes a first part which is thermally conductive and electrically insulating, an integrated circuit supported on the first part on one side thereof, a second part which is spaced from the first part on a side thereof opposite from the integrated circuit, the second part being electrically insulating, and a thermoelectric cooling element which is disposed between the first and second parts and which is thermally coupled to the first part on a side thereof opposite from the integrated circuit. A further element which is electrically conductive and thermally insulating is disposed between the first and second parts. An electrically conductive first arrangement is operative to electrically couple the integrated circuit to a first end of the further element located adjacent the first part, and an electrically conductive second arrangement is electrically coupled to a second end of the further element located adjacent the second part.

A different form of the present invention involves the provision of an apparatus which includes: a package having therein a chamber; an integrated circuit disposed within the chamber in the package; and a plurality of thermoelectric cooling elements disposed within the package, a first group of the thermoelectric cooling elements each having a first cross-sectional shape, and a second group of the thermoelectric cooling elements each having a second cross-sectional shape which is different from the first cross-sectional shape, the second group being mutually exclusive from the first group.

BRIEF DESCRIPTION OF THE DRAWINGS

A better understanding of the present invention will be realized from the detailed description which follows, taken in conjunction with the accompanying drawings, in which:

FIG. 1 is a diagrammatic sectional side view of an integrated circuit package which embodies the present invention, the package having therein an integrated circuit and a plurality of thermoelectric cooling elements;

FIG. 2 is a diagrammatic sectional view taken along the line 2—2 in FIG. 1;

FIG. 3 is a diagrammatic sectional view similar to FIG. 2, but showing an alternative embodiment of the package of FIGS. 1 and 2;

DETAILED DESCRIPTION OF THE INVENTION

Figure 4:
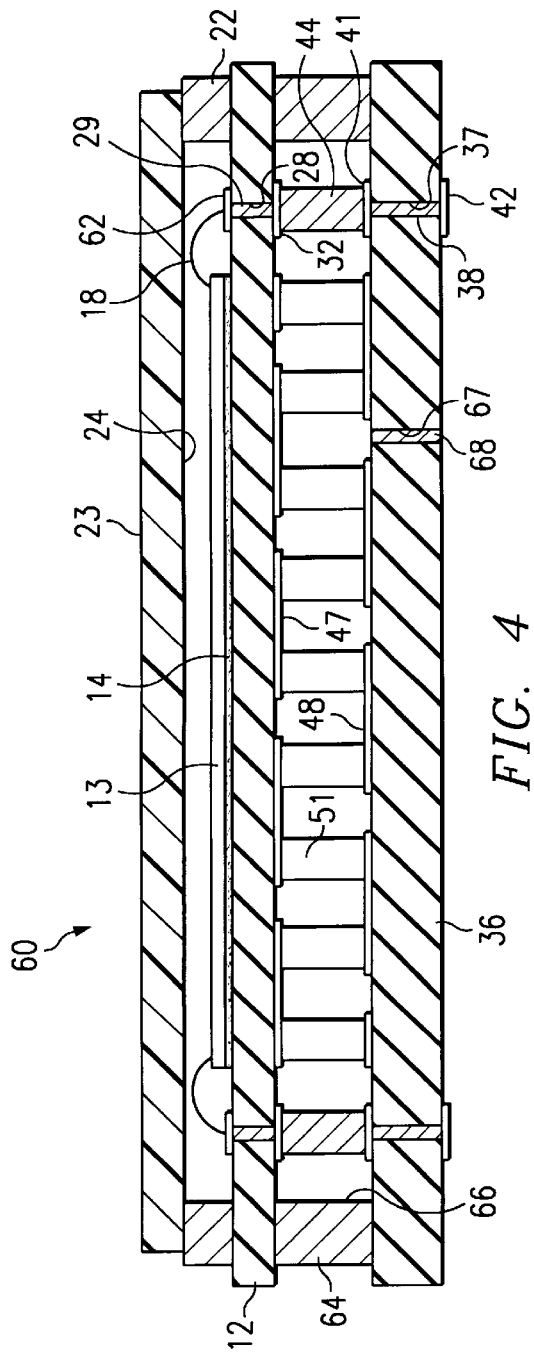
FIG. 4 is a diagrammatic sectional side view similar to FIG. 1, but showing another alternative embodiment of the package of FIG. 1.

FIG. 1 is a diagrammatic sectional side view of an integrated circuit package 10 which embodies the present invention. The package 10 includes a platelike integrated circuit support part 12. The part 12 is made of a known ceramic material which is thermally conductive and electrically insulating, such as aluminum oxide ($Al_2O_3$) or aluminum nitride (AlN). An integrated circuit 13 is fixedly secured to the upper side of the part 12 by a thin layer 14 of a thermally conductive epoxy or solder. In the disclosed embodiment, the integrated circuit 13 is an infrared detector of known construction, but it will be recognized that the integrated circuit 13 could be some other type of semiconductor device.

The package 10 includes a plurality of electrically conductive leads provided at spaced locations around the integrated circuit 13, one of these leads being identified with reference numeral 17. In FIG. 1, for reasons of clarity, the relative thickness of the leads 17 is significantly exaggerated. The inner end of each lead 17 is coupled by a respective wirebond to the integrated circuit 13, one of these wirebonds being designated by reference numeral 18.

The package 10 includes a frame 22 which extends around the integrated circuit 13 and which is sealingly secured to the leads 17 and to the upper surface of the part 12. A platelike window 23 has its peripheral edges supported on and sealingly secured to the frame 22. The window 23 is made of a material which is transparent to infrared radiation, such germanium or silicon, so that infrared radiation impinging on the device 10 in a downward direction will pass through the window 23 and reach the infrared detector 13. The window 23, frame 22 and part 12 together serve as a housing, which has therein a chamber 24 containing the integrated circuit 13. During manufacture of the package 10, the window 23 is sealingly secured to the frame 22 within a room or chamber which is under a vacuum, so that the chamber 24 within the housing of the package is subject to a vacuum in the completed device.

In FIG. 1, the horizontal dimension of the frame 22 is such that the frame 22 does not cover the outer ends of the leads 17. However, as shown by a broken line in FIG. 1, the frame 22 could have a larger horizontal dimension, so that it completely covers the outer end of each of the leads 17.

The part 12 has a plurality of via openings therethrough, one of which is identified by reference numeral 28. Each of the via openings 28 is disposed under the outer end of a respective one of the leads 17. Each via opening 28 is filled with a metal or other electrically conductive material 29, which engages the outer end of the associated lead 17 so as to create an electrical connection therebetween. The part 12 has a plurality of metal pads 32 formed on the underside thereof, each pad 32 covering a respective via opening 28, and being in electrical engagement with the conductive material 29 in the via opening 28. The leads 17 and pads 32 may be formed by screen printing tungsten or molymanganese onto the part 12 and onto the ends of the conductive material 29 in each of the via openings 28, firing the part 12, and then plating.

The package 10 includes a platelike base part 36, which is spaced below and extends approximately parallel to the integrated circuit support part 12. The base part 36 may be made of the same ceramic material as the support part 12. The part 36 has a plurality of via openings 37 extending vertically therethrough. In FIG. 1, each of the via openings 37 is disposed directly below a respective one of the via openings 28. Each of the via openings 37 is filled with a metal or other conductive material 38. A plurality of electrically conductive metal pads 41 are provided on the upper side of the part 36. Each of the pads 41 is disposed over and electrically engages the upper end of the conductive material 38 in a respective one of the via openings 37. In a similar manner, a plurality of conductive metal pads 42 are provided on the underside of the part 36, and each of the pads 42 is disposed over and electrically engages the lower end of the conductive material 38 in a respective one of the via openings 37. The pads 42 may be used to surface mount the package 10 on a not-illustrated circuit board, in a known manner.

A plurality of electrically conductive elements 44 are disposed between the parts 12 and 36, each of the elements 44 having its upper end soldered to a respective one of the pads 32 on the part 12, and its lower end soldered to a respective one of the pads 41 on the part 36. Thus, each of the pads 42 is electrically coupled to a respective terminal on the integrated circuit 13, in particular through the conductive material 38 in a respective via opening 37, a respective pad 41, a respective conductive element 44, a respective pad 32, the conductive material 29 in a respective one of the via openings 28, a respective lead 17 and a respective wirebond 18.

The part 12 has on the underside thereof, below the integrated circuit 13, a plurality of metal leads 47. The part 36 has on the upper side thereof, below the integrated circuit 13, a plurality of metal leads 48. A plurality of thermoelectric cooling (TEC) elements of known construction, one of which is designated at 51, are disposed between the parts 12 and 36. The TEC elements 51 each have an upper end soldered to a respective one of the leads 47, and a lower end soldered to a respective one of the leads 48. The leads 47 and 48 electrically couple all of the TEC elements 51 in series. Two not-illustrated via openings are provided through the base part 36, and are each filled with a conductive material which is electrically coupled to a respective lead 48, so that a current can be caused to flow through the series-connected TEC elements 51. When an electrical current is passed through the TEC elements 51, the TEC elements 51 withdraw heat from the integrated circuit 13 through the epoxy layer 14 and part 12, and discharge this heat to the part 36, and to the ambient air present between the TEC elements 51. It will be recognized that, when necessary, the current can be reversed so that the TEC elements supply heat to the integrated circuit.

The electrically conductive elements 44 should have a thermal conductivity which is as low as possible. This does not mean that the elements 44 necessarily have no thermal conductivity, but that the cumulative thermal conductivity of all of the elements 44 should be negligible in comparison to the cumulative thermal conductivity of all of the TEC elements 51. A suitable material for the electrically conductive elements 44 is a polyimide thermoplastic which is commercially available under the tradename MELDIN 3000H from Furon Company of Laguna Niguel, Calif. Another suitable thermoplastic material is commercially available under the tradename SC535 MCS from DuPont Engineering Polymers of Wilmington, Del. In order to facilitate soldering of the TEC elements 51 and elements 44 to the pads 32 and 41, the upper and lower ends of the TEC elements 51 and the elements 44 may be subjected, during their manufacture, to thin film deposition, followed by plating of a metal over the deposited thin film.

As discussed above, the chamber 24 is subject to a vacuum. It will be noted that none of the via openings 28 and 37 have either end disposed at an interior wall of the chamber 24. This is facilitated by the leads 17, which extend from a location within the chamber to a location externally of the chamber. As a result, the conductive material 29 and 38 disposed within the via openings 28 and 37 need not seal each of these via openings against the introduction of any air or gas into the chamber 24, which helps to ensure the integrity over time of the vacuum within the chamber 24.

FIG. 2 is a sectional view taken along the line 2—2 in FIG. 1, and shows one of the elements 44 and five of the TEC elements 51. It will be noted from FIG. 2 that the element 44 and the TEC elements 51 each have a cross-sectional shape which is a square. Further, the TEC elements include alternating elements of p-type material and n-type material.

FIG. 3 is a diagrammatic sectional view similar to FIG. 2, but showing an alternative embodiment of the package of FIGS. 1 and 2. More specifically, in FIG. 3, the p-type elements have a first cross-sectional shape, which is a square, the n-type elements have a different cross-sectional shape, which is a parallelogram, and the element 44 has yet another cross-sectional shape, which is a triangle. As a result, the p-type elements and n-type elements can be readily visually distinguished from each other, and the elements 44 can be readily visually distinguished from the TEC elements 51, which facilitates rapid and accurate assembly of the package.

It will be recognized that other cross-sectional shapes could be used for the TEC elements 51, so long as the cross-sectional shape for the p-type elements is different from the cross-sectional shape for the n-type elements. For example, the p-type elements could all have a common cross-sectional shape which is one of a square, a rectangle, a parallelogram, or a triangle, and the n-type elements could all have a common cross-sectional shape which is a different one of these four geometric shapes. Although other geometric shapes could be used, these four geometric shapes are particularly advantageous because a plurality of such elements can be cut from a single wafer without wasting material.

FIG. 4 is a diagrammatic sectional side view which is similar to FIG. 1, but which shows an integrated circuit package 60 that is an alternative embodiment of the package 10 of FIG. 1. Parts in FIG. 4 which are equivalent to parts in FIG. 1 are identified with the same reference numerals. Only the differences between FIGS. 1 and 4 are described below in detail.

More specifically, in FIG. 4, the part 12 has on the upper side thereof a plurality of pads 62, which are each disposed over and in electrical engagement with the conductive material 29 in a respective one of the via openings 28. The wirebonds 18 each extend between the integrated circuit 13 and a respective one of the pads 62. The frame 22 is located outwardly of the pads 62, so that the pads 62 are each disposed within the chamber 24. A further frame 64 is disposed between and is sealingly secured to the parts 12 and 36. The frame 64 may be made of a ceramic material which is thermally insulating. The conductive elements 44 and TEC elements 51 are all disposed within the frame 64.

In FIG. 4, the window 23, frame 22, support part 12, frame 64 and base part 36 together serve as a housing, which has therein the chamber 24 that contains the integrated circuit 13, and which has therein a separate chamber 66 that is located between the parts 12 and 36 and that contains the conductive elements 44 and the TEC elements 51. The part 36 has therethrough an opening 67, which communicates at its upper end with the chamber 66. The opening 67 is used to remove air and other gases from the chamber 66 during assembly, after which the opening 67 is sealingly filled with a seal material 68. The chamber 24 containing the integrated circuit 13 is also subject to a vacuum which, as discussed above in association with FIG. 1, is realized by sealing the window 23 to the frame 22 within a room or space that is under a vacuum. The conductive material 29 and 38 in the via openings 28 and 37 completely seals these via openings, in order to maintain the vacuum in each of the chambers 24 and 66.

Figure 5:
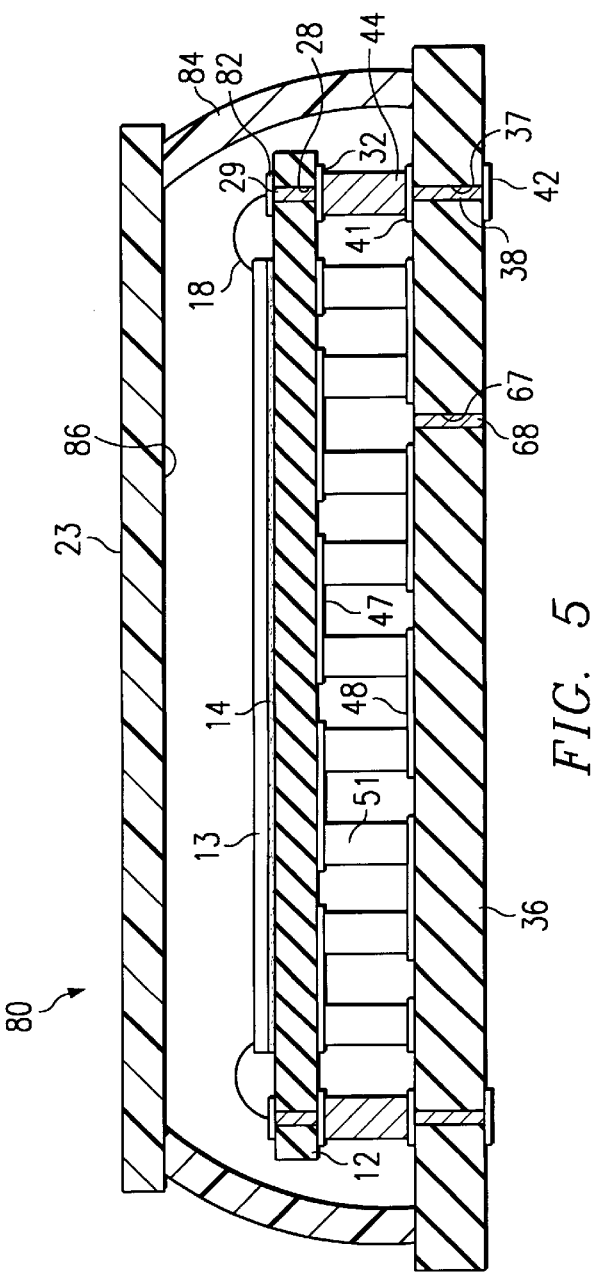
FIG. 5 is a diagrammatic sectional side view similar to FIG. 1, but showing still another alternative embodiment of the package of FIG. 1.

FIG. 5 is a diagrammatic sectional side view similar to FIG. 1, but showing an integrated circuit package 80 that is yet another alternative embodiment of the package 10 of FIG. 1. Equivalent parts are designated with the same reference numerals in FIGS. 1 and 5, and only the differences are described in detail below. With reference to FIG. 5, the part 12 has on an upper side thereof a plurality of pads 82, which are each disposed over and electrically engage the conductive material 29 in a respective one of the via openings 28. Each of the wirebonds 18 extends between the integrated circuit 13 and a respective one of the pads 82. A frame 84, which may be made of a material such as a metal or ceramic, extends between and sealingly engages peripheral edges of the part 36 and the window 23. The window 23, frame 84 and part 36 serve as a housing which has therein a chamber 86. The structure within the chamber 86 includes the integrated circuit 13, the part 12, the conductive elements 44, and the TEC elements 51. After the housing has been assembled, the opening 67 through the part 36 is used to withdraw air and gases from the chamber 86, in order to place the chamber 86 under a vacuum. Then, the opening 67 is permanently sealed with a seal material 68.

The present invention provides a number of technical advantages. One such advantage is that the disclosed packages can be manufactured at a relatively low cost. Also, the conductive elements disposed between the integrated circuit support part and the base part avoid the need for relatively long wirebonds, while mechanically strengthening the interconnection between the integrated circuit support part and the base part. A further advantage is that, in the disclosed embodiments in which the TEC elements are not within the chamber containing the integrated circuit, outgassing of the TEC elements does not occur within that chamber when it is subjected to a vacuum. Yet another advantage is that the width of the package may be reduced in comparison to the widths of known packages. Still another advantage is that the flat ceramic base part facilitates use of low tolerances in a direction vertically of the package, which in turn simplifies the manufacturing process for the package. The use of different cross-sectional shapes for the p-type TEC elements, the n-type TEC elements and/or the conductive elements has the advantage of facilitating rapid and accurate assembly of the package.

Although several embodiments have been illustrated and described in detail, it should be understood that still other substitutions and alternations, including the rearrangement or reversal of parts, can be made without departing from the spirit and scope of the present invention, as defined by the following claims.

What is claimed is:

1. An apparatus, comprising
   a first part which is thermally conductive and electrically insulating;
   an integrated circuit supported on one side of said first part;
   a second part which is spaced from said first part on a side thereof opposite from said integrated circuit, said second part being electrically insulating;
   a thermoelectric cooling element which is disposed between said first and second parts and which is thermally coupled to said first part on a side thereof opposite from said integrated circuit;

a further element which is electrically conductive and thermally insulating, and which is disposed between said first and second parts;

an electrically conductive first arrangement which is operative to electrically couple said integrated circuit to a first end of said further element disposed adjacent said first part; and an electrically conductive second arrangement which is electrically coupled to a second end of said further element disposed adjacent said second part.

2. An apparatus according to claim 1, wherein said second part is thermally conductive, and wherein said thermoelectric cooling element is thermally coupled to said second part.

3. An apparatus according to claim 1, wherein said first arrangement includes a via opening provided through said first part and an electrically conductive material disposed within said via opening.

4. An apparatus according to claim 1, wherein said first arrangement includes a via opening provided through said first part and an electrically conductive material disposed within said via opening;

including a housing having a chamber therein, said first part being a portion of said housing, and said integrated circuit being disposed within said chamber; and wherein an end of said via opening nearest said integrated circuit opens through a surface portion of said first part which is disposed within said chamber.

5. An apparatus according to claim 1, wherein said first arrangement includes a via opening provided through said first part and an electrically conductive material disposed within said via opening; and including a housing having a chamber therein, said first part being a portion of said housing, said integrated circuit being disposed within said chamber, and an end of said via opening nearest said integrated circuit being disposed externally of said chamber.

6. An apparatus according to claim 5, wherein said first arrangement includes an electrically conductive lead extending from said end of said via opening to a location within said chamber, and includes a wirebond extending from said integrated circuit to an end of said lead disposed within said chamber.

7. An apparatus according to claim 1, wherein said first arrangement includes a first via opening provided through said first part and an electrically conductive material disposed within said first via opening, and includes a electrically conductive first pad which is provided on a side of said first part opposite from said integrated circuit and which is in engagement with said electrically conductive material in said first via opening;

wherein said second arrangement includes a second via opening provided through said second part and an electrically conductive material disposed within said second via opening, and includes an electrically conductive second pad which is disposed on a side of said second part nearest said first part and which is in engagement with said electrically conductive material in said second via opening; and wherein said further element has first and second ends which are respectively electrically coupled to said first and second pads.

8. An apparatus according to claim 7, wherein said second arrangement includes an electrically conductive third pad which is provided on a side of said second part opposite from said first part and which is in engagement with said electrically conductive material in said second via opening; and wherein said first arrangement includes an electrically conductive part which is provided on a side of said first part remote from said further element and which is in engagement with said electrically conductive material in said first via opening, and includes a wirebond extending between said integrated circuit and said conductive part.

9. An apparatus according to claim 1, including a housing having therein a chamber, at least one of said first and second parts being a portion of said housing, and said integrated circuit being disposed within said chamber, said housing having on a side of said chamber opposite from said integrated circuit a portion which is transparent to infrared radiation; and wherein said integrated circuit is an infrared radiation detector.

10. An apparatus according to claim 1, including a housing having a chamber therein, said first part being a portion of said housing, said integrated circuit being disposed within said chamber, and said thermoelectric cooling element being disposed externally of said chamber.

11. An apparatus according to claim 10, wherein said housing has therein a further chamber which is separate from said chamber having said integrated circuit therein, said further chamber having said thermoelectric cooling element therein, and each of said chambers having a vacuum therein.

12. An apparatus according to claim 1, including a plurality of further thermoelectric cooling elements disposed between said first and second parts and thermally coupled to said first part on the side thereof opposite from said integrated circuit, wherein a first group of said thermoelectric cooling elements each have a first cross-sectional shape, and wherein a second group of said thermoelectric cooling elements mutually exclusive from said first group each have a second cross-sectional shape which is different from said first cross-sectional shape.

13. An apparatus according to claim 12, wherein said further element has a third cross-sectional shape which is different from each of said first and second cross-sectional shapes.

14. An integrated circuit package, comprising:

a housing having a chamber therein, said housing including on one side of said chamber a platelike first portion which is thermally conductive and electrically insulating, and having on the other side of said chamber a window portion made of a material which is transparent to infrared radiation;

an integrated circuit supported within said chamber on said first portion, said integrated circuit being an infrared radiation detector;

a platelike second portion which is provided on a side of said first portion opposite from said integrated circuit and which is spaced from said first portion, said second portion being electrically insulating and thermally conductive;

a plurality of thermoelectric cooling elements which are disposed between said first and second portions and which are thermally coupled to each of said first and second portions;

a further element which is electrically conductive and thermally insulating, and which is disposed between said first and second portions;

an electrically conductive first arrangement which is operative to electrically couple said integrated circuit to a first end of said further element disposed adjacent said first portion, said first arrangement including a first via opening provided through said first part and an electrically conductive material disposed within said first via opening; and an electrically conductive second arrangement which is electrically coupled to a second end of said further element disposed adjacent said second portion, said second arrangement including a second via opening provided through said second part and an electrically conductive material disposed within said second via opening.

15. An integrated circuit package according to claim 14, wherein said second portion is a part of said housing;

wherein said housing has therein a further chamber which is disposed between said first and second portions and which is isolated from said chamber containing said integrated circuit, said thermoelectric cooling elements being disposed within said further chamber; and wherein each of said chambers is subject to a vacuum.

16. An apparatus, comprising:

a package having therein a chamber, having first and second electrically conductive terminals on an outer side thereof;

an integrated circuit disposed within said chamber in said package;

a plurality of thermoelectric cooling elements disposed within said package, a first group of said thermoelectric cooling elements each having a first cross-sectional shape, and a second group of said thermoelectric cooling elements mutually exclusive from said first group each having a second cross-sectional shape which is different from said first cross-sectional shape, said elements of said first and second groups being respectively made of first and second types of material which are different; and electrical conductors electrically coupling said thermoelectric cooling elements between said first and second terminals so that current flowing from said first terminal to said second terminal passes through said thermoelectric cooling elements.

17. An apparatus according to claim 16, wherein said first and second cross-sectional shapes are each a respective one of a square, a rectangle, a parallelogram and a triangle.

\* \* \* \* \*